(12) United States Patent
Tomoeda et al.

(10) Patent No.: US 12,464,938 B2
(45) Date of Patent: Nov. 4, 2025

(54) SPRAYING DEVICE AND METHOD OF MANUFACTURING DISPLAY DEVICE

(71) Applicant: Samsung Display Co., LTD., Yongin-si (KR)

(72) Inventors: Satoshi Tomoeda, Yokohama (JP); Takahiko Noda, Yokohama (JP); Setsu Takeuchi, Yokohama (JP)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/226,359

(22) Filed: Jul. 26, 2023

(65) Prior Publication Data

US 2024/0147827 A1    May 2, 2024

(30) Foreign Application Priority Data

Oct. 27, 2022  (KR) ........................ 10-2022-0140079

(51) Int. Cl.
| | | |
|---|---|---|
| *H10K 71/13* | (2023.01) | |
| *B41J 2/07* | (2006.01) | |
| *B41J 2/155* | (2006.01) | |
| *H10K 59/12* | (2023.01) | |

(52) U.S. Cl.
CPC .............. *H10K 71/135* (2023.02); *B41J 2/07* (2013.01); *B41J 2/155* (2013.01); *H10K 59/1201* (2023.02)

(58) Field of Classification Search
CPC .......................... H10K 71/135; H10K 59/1201
See application file for complete search history.

(56) References Cited

U.S. PATENT DOCUMENTS

| | | |
|---|---|---|
| 8,740,331 B2 | 6/2014 | Xie |
| 9,224,952 B2 | 12/2015 | Harjee et al. |
| 9,802,403 B2 | 10/2017 | Harjee et al. |
| 2016/0311219 A1* | 10/2016 | Harjee ................ B41J 2/04581 |

FOREIGN PATENT DOCUMENTS

| | | |
|---|---|---|
| JP | 2011529001 A | 12/2011 |
| JP | 5515627 B2 | 4/2014 |
| JP | 6659532 B2 | 3/2020 |
| KR | 1020220001519 A | 1/2022 |
| KR | 1020220047172 A | 4/2022 |

* cited by examiner

*Primary Examiner* — Kelly M Gambetta
(74) *Attorney, Agent, or Firm* — CANTOR COLBURN LLP

(57) ABSTRACT

A method of manufacturing a display device includes preparing a spraying device including a plurality of nozzles, dividing a discharge amount value range between a first reference discharge amount value and a second reference discharge amount value into k areas (k is a natural number), generating nozzle sets by combining n nozzles (n is a natural number) among m nozzles (m is a natural number, m≥n) for each of a plurality of nozzle groups, where the nozzle sets have a same discharge amount value as one another or different discharge amount values from one another, and each of the plurality of nozzle groups is defined by the m nozzles among the plurality of nozzles, and deriving an active nozzle group in which the nozzle sets are distributed in a preset manner in the k areas from the plurality of nozzle groups.

15 Claims, 6 Drawing Sheets

SPRAYING DEVICE AND METHOD OF MANUFACTURING DISPLAY DEVICE

This application claims priority to Korean Patent Application No. 10-2022-0140079, filed on Oct. 27, 2022, and all the benefits accruing therefrom under 35 U.S.C. § 119, the content of which in its entirety is herein incorporated by reference.

BACKGROUND

1. Field

The disclosure relates to a spraying device and a method of manufacturing a display device using the straying device, and more particularly, to a spraying device which may prevent a luminance differential from occurring in a display device, and a method of manufacturing a display device using the straying device.

2. Description of the Related Art

An optical pattern, a color filter, or a light emitting layer of a display panel may be formed using a spraying device. For example, the spraying device may form a component constituting a display panel by spraying an ink including a base material and particles dispersed in the base material onto a target substrate.

SUMMARY

Embodiments of the disclosure provide a spraying device and a method of manufacturing a display device which may uniformize the sum of discharge amount values of nozzles inside an application area by determining which nozzles are activated for each application area of a target substrate when a material is sprayed onto the target substrate using a nozzle.

According to an embodiment, a method of manufacturing a display device includes preparing a spraying device including a plurality of nozzles, dividing a discharge amount value range between a first reference discharge amount value and a second reference discharge amount value into k areas, where k is a natural number, generating nozzle sets by combining n nozzles among m nozzles for each of a plurality of nozzle groups, wherein n is a natural number, and m is a natural number greater than or equal to n, wherein the nozzle sets have a same discharge amount value as one another or different discharge amount values from one another, and each of the plurality of nozzle groups is defined by the m nozzles among the plurality of nozzles, and deriving an active nozzle group in which the nozzle sets are distributed in a preset manner in the k areas from the plurality of nozzle groups.

In an embodiment, in the active nozzle group, a same number of the nozzle sets may be distributed in each of the k areas.

In an embodiment, in the active nozzle group, a sum of a number of the nozzle sets positioned in one area and a number of the nozzle sets positioned in an area adjacent to the one area among the k areas may be twice a number of the nozzle sets positioned in an area not adjacent to the one area.

In an embodiment, the method may further include activating nozzles of the active nozzle group to spray a material to an application area of a target substrate.

In an embodiment, the application area may be provided in plural, a plurality of application areas may be arranged in one direction and a direction intersecting the one direction, and the deriving of the active nozzle group may be repeatedly performed for each of the plurality of application areas.

In an embodiment, in the active nozzle group positioned in the plurality of application areas, distribution relationships of the nozzle sets may be the same as or different from each other according to the plurality of application areas.

In an embodiment, k may be a multiple of 5, and a total number of the nozzle sets of one nozzle group distributed over the k areas may be a multiple of k.

In an embodiment, m may be 5, n may be 2, and k may be 5.

In an embodiment, range widths of the k areas may be the same as each other.

In an embodiment, the first reference discharge amount value and the second reference discharge amount value may be a minimum discharge amount value and a maximum discharge amount value of n selected nozzles among the plurality of nozzles, respectively.

According to an embodiment, a method of manufacturing a display device includes preparing a spraying device including a plurality of nozzles, dividing a discharge amount value range between a first reference discharge amount value and a second reference discharge amount value into k areas for one application area among a plurality of application areas on a target substrate, wherein k is a natural number, generating nozzle sets by combining n nozzles among m nozzles for each of a plurality of nozzle groups, where n is a natural number, and m is a natural number greater than or equal to n, and wherein the nozzle sets have a same discharge amount value as one another or different discharge amount values from one another, and each of the plurality of nozzle groups is defined by the m nozzles among the plurality of nozzles, and deriving an active nozzle group in which the nozzle sets are distributed in a preset manner in the k areas from the plurality of different nozzle groups.

In an embodiment, the discharge amount value range between the first reference discharge amount value and the second reference discharge amount value for each of the plurality of application areas may be different from or the same as each other.

In an embodiment, in the active nozzle group, a same number of the nozzle sets may be distributed in each of the k areas.

In an embodiment, m may be 5, n may be 2, and k may be 5.

In an embodiment, the method may further include activating nozzles of the active nozzle group to spray a material thereto on the target substrate, and the deriving the active nozzle group may be repeatedly performed for each of the plurality of application areas.

According to an embodiment, a spraying device which is disposed on a target substrate including a plurality of application areas and includes a plurality of nozzle groups each defined by a plurality of nozzles, where the plurality of nozzle groups each including the plurality of nozzles has a same discharge amount as or different discharge amounts from one another, and the spraying device includes a controller which adjusts whether to activate some nozzles among the plurality of nozzles of each of the plurality of nozzle group.

In an embodiment, the controller may generate nozzle sets by combining n nozzles among m nozzles of each of the plurality of nozzle groups in a discharge amount value range between a first reference discharge amount value and a second reference discharge amount value divided into k areas, may derive an active nozzle group in which the nozzle sets are distributed in a preset from the plurality of nozzle groups, and may activate the nozzles of the active nozzle group, where k may be a natural number, n may be a natural number, and m may be a natural number greater than or equal to n, and where each of the plurality of nozzle groups may be defined by the m nozzles among the plurality of nozzles.

In an embodiment, the application area may be provided in plural, a plurality of application areas may be arranged in one direction and a direction intersecting the one direction, and the plurality of nozzle groups may be arranged on the plurality of application areas, respectively.

In an embodiment, in the active nozzle group, a same number of the nozzle sets may be distributed in each of the k areas.

In an embodiment, m may be 5, n may be 2, and k may be 5.

BRIEF DESCRIPTION OF THE DRAWINGS

The above and other features of embodiments of the disclosure will become apparent by describing in detail embodiments thereof with reference to the accompanying drawings.

DETAILED DESCRIPTION

Figure 1:
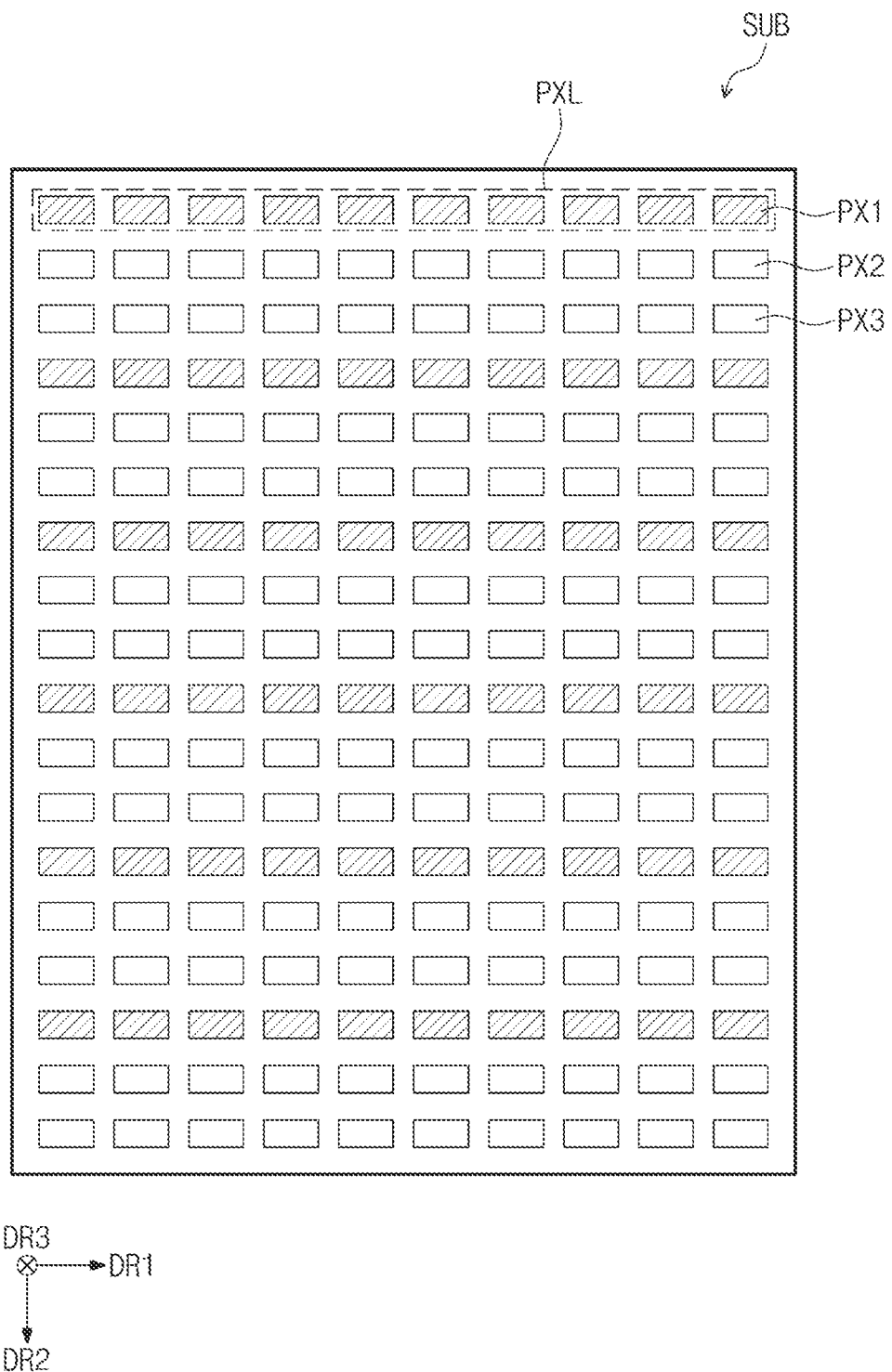
FIG. 1 is a plan view of a target substrate according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or area, layer, part, portion, etc.) is "on", "connected with", or "coupled to" a second component means that the first component is directly on, connected with, or coupled to the second component or means that a third component is interposed therebetween.

The same reference numerals refer to the same components. Further, in the drawings, the thickness, the ratio, and the dimension of components are exaggerated for effective description of technical contents.

Although the terms "first", "second", etc. may be used to describe various components, the components should not be limited by the terms. The terms are only used to distinguish one component from another component. For example, without departing from the right scope of the disclosure, a first component may be referred to as a second component, and similarly, the second component may be also referred to as the first component.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

Unless otherwise defined, all terms (including technical terms and scientific terms) used in the specification have the same meaning as commonly understood by those skilled in the art to which the disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Hereinafter, embodiments of the disclosure will be described in detail with reference to the accompanying drawings.

FIG. 1 is a plan view of a target substrate according to an embodiment of the disclosure.

Referring to FIG. 1, a target substrate SUB may have a rectangular plate shape on a plane defined by a first direction DR1 and a second direction DR2. A plurality of pixels PX1, PX2, and PX3 may be formed on the target substrate SUB. The target substrate SUB illustrated in FIG. 1 may be an intermediate substrate in which at least portions of organic layers included in the plurality of pixels PX1, PX2, and PX3 are not completed (or not completely formed).

The plurality of pixels PX1, PX2, and PX3 may be arranged in a matrix form in the first direction DR1 and the second direction DR2. In FIG. 1, for convenience of illustration and description, pixels in 10 columns are spaced apart from each other in the first direction DR1, and pixels in 18 rows are spaced apart from each other in the second direction DR2 are shown. However, a larger number of pixels may be actually arranged on the target substrate SUB. Alternatively, the plurality of pixels PX1, PX2, and PX3 may be arranged not only in a matrix form but also in a stripe form or a Pentile™ form.

The plurality of first pixels PX1, the plurality of second pixels PX2, and the plurality of third pixels PX3 may be arranged on the target substrate SUB. The plurality of first pixels PX1, the plurality of second pixels PX2, and the plurality of third pixels PX3 may be arranged side by side in the first direction DR1. Thus, one pixel row PXL may be a row including the first pixels PX1, a row including the second pixels PX2, or a row including the third pixels PX3. Hereinafter, in the specification, the first direction DR1 may be referred to as row direction. A pixel row including the plurality of first pixels PX1, a pixel row including the plurality of second pixels PX2, and a pixel row including the plurality of third pixels PX3 may be sequentially and repeatedly arranged in the second direction DR2. Hereinafter, in the specification, the second direction DR2 may be referred to as a column direction. A third direction DR3 may be a direction perpendicular to a plane defined by the first direction DR1 and the second direction DR2 or a thickness direction of the target substrate SUB.

The plurality of first pixels PX1, the plurality of second pixels PX2, and the plurality of third pixels PX3 arranged on the target substrate SUB may display different colors from each other or a same color as each other. In an embodiment, for example, the plurality of first pixels PX1 may display red color, the plurality of second pixels PX2 may display green color, and the plurality of third pixels PX3 may display blue color. Alternatively, the plurality of first pixels PX1 may display red color, the plurality of second pixels PX2 may display green color, and the plurality of third pixels PX3 may display blue color. Alternatively, all the plurality of first pixels PX1, the plurality of second pixels PX2, and the plurality of third pixels PX3 may display blue color. However, this is merely an example, and colors displayed by the plurality of first pixels PX1, the plurality of second pixels PX2, and the plurality of third pixels PX3 are not limited to the above-described example.

Figure 2A:
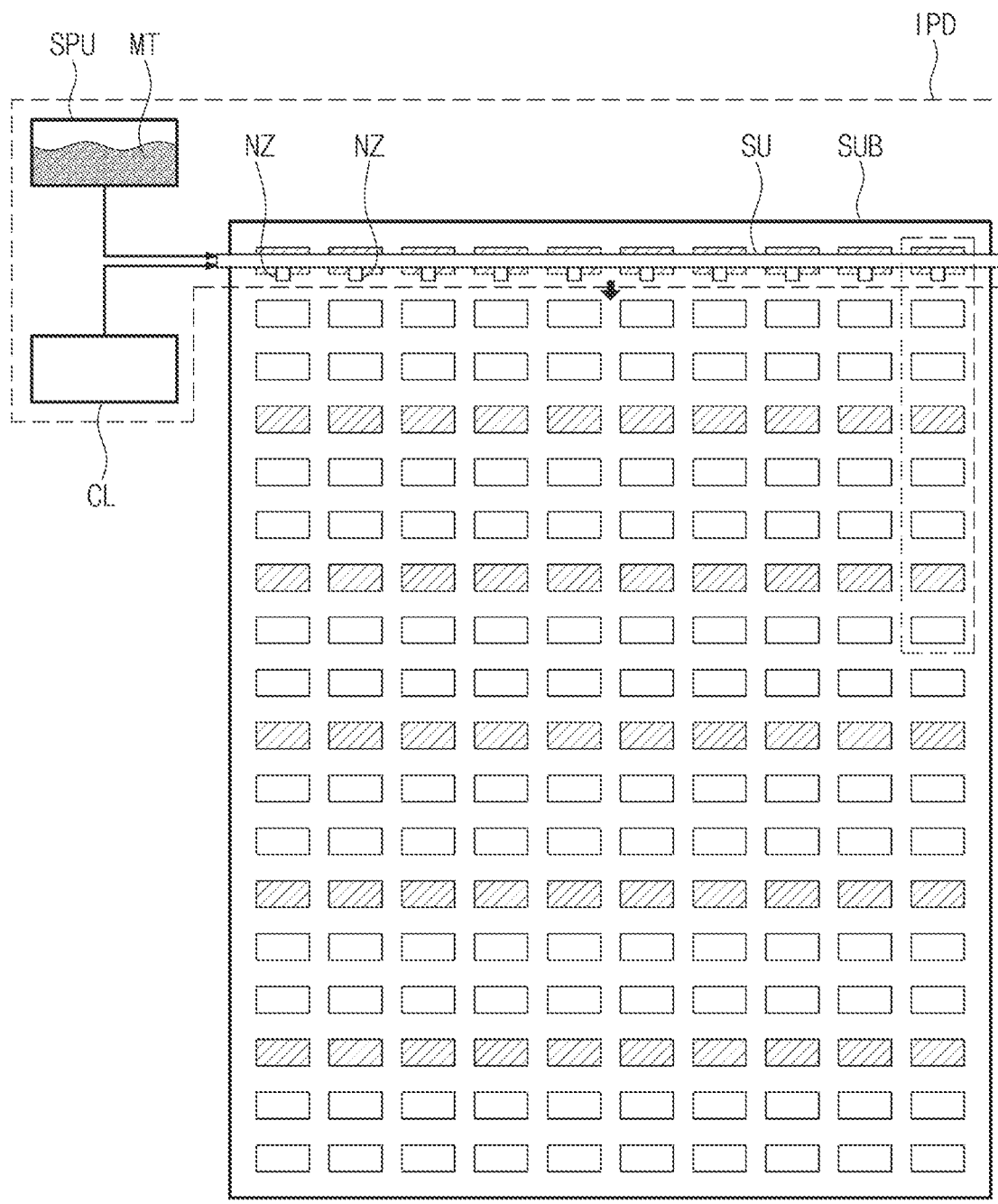
FIGS. 2A and 2B are plan views illustrating a spraying device according to an embodiment of the disclosure.
Figure 2B:
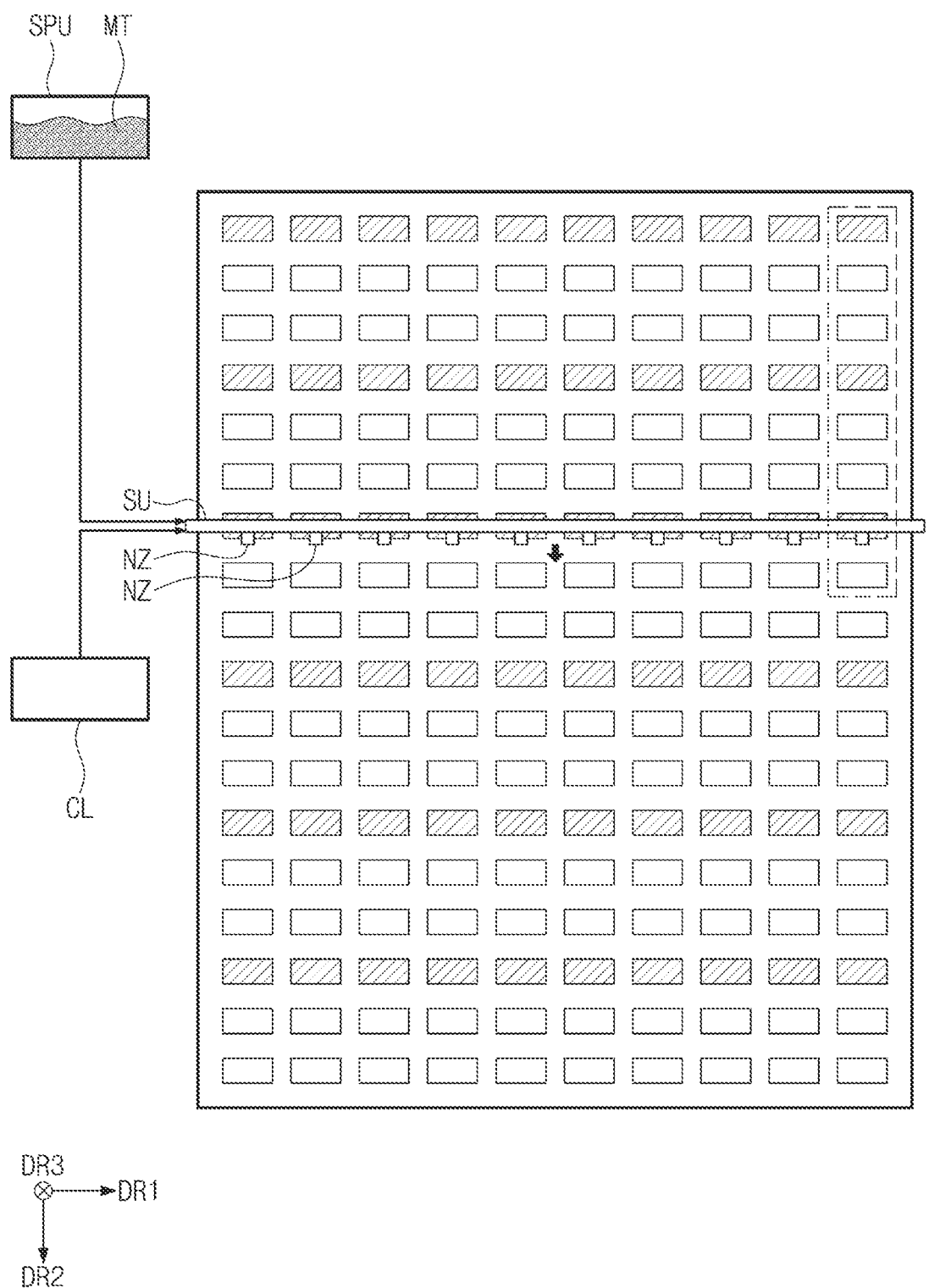

FIGS. 2A and 2B are plan views illustrating a spraying device according to an embodiment of the disclosure.

Referring to FIG. 2A, a spraying device IPD according to an embodiment of the disclosure may include a spraying unit SU, a supply unit SPU, and a controller CL.

The supply unit SPU may be connected to the spraying unit SU and provide a material MT to be sprayed to the target substrate SUB through the spraying unit SU. The material MT provided by the supply unit SPU may be an organic material. In an embodiment, for example, the organic material provided to the spraying unit SU by the supply unit SPU may be a light emitting material that emits one-color light.

In an embodiment, as described above, the light emitting material may be sprayed using the spraying device IPD, but a configuration that may be formed using the spraying device IPD is not limited to the above example. In an embodiment, for example, where a display panel is a nano-light emitting diode (LED) display panel, a light emitting layer of the nano-LED display panel may be formed using the spraying device IPD. In such an embodiment, the material MT may include a nano-sized LED chip mixed (or dispersed) in a solvent (for example, water). In an embodiment, a color filter and a wavelength conversion pattern may be formed using the spraying device IPD. In an embodiment, for example, the spraying device IPD may be an inkjet printing device, but the disclosure is not limited thereto, and the spraying device IPD may be provided as various devices.

Although not illustrated, the spraying device IPD according to an embodiment of the disclosure may further include a movement unit that moves the spraying unit SU. The spraying unit SU may move in the second direction DR2, which is a column direction of the plurality of first pixels PX1, by the movement unit. The spraying unit SU may spray the organic material to a row of each of the plurality of first pixels PX1 arranged in the first direction DR1 while moving in the second direction DR2.

In an embodiment, as illustrated in the drawings, the spraying device IPD may include a single spraying unit SU, but the disclosure is not limited thereto, and alternatively, the spraying device IPD may include a plurality of spraying units SU. In an embodiment, the spraying unit SU may be provided to cover the entire target substrate SUB.

The spraying unit SU may be positioned on the target substrate SUB and spray the material MT to the target substrate SUB.

The spraying unit SU may extend in the first direction DR1 which is a row direction of the of first pixels PX1. FIG. 2A illustrates an embodiment where the spraying unit SU extends to overlap the first pixels PX1 arranged in the first direction DR1.

Figure 3:
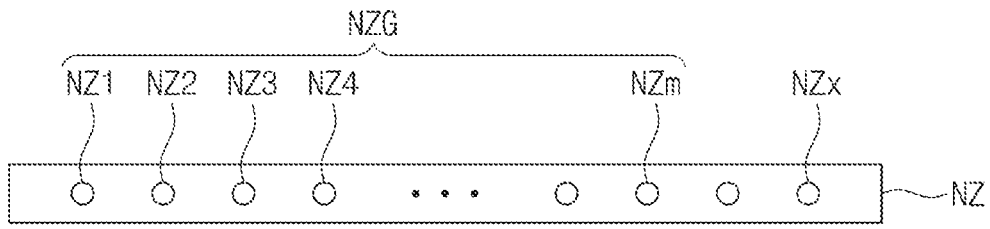
FIG. 3 is an enlarged plan view of a portion of the spraying device according to an embodiment of the disclosure.

The spraying unit SU may include a plurality of nozzle heads NZ. FIGS. 2A and 2B illustrate an embodiment where one nozzle head NZ is arranged for each of the pixels PX1, PX2, and PX3, and thus total 10 nozzle heads NZ arranged in the first direction DR1 are illustrated in FIGS. 2A and 2B, but the disclosure is not limited thereto. A plurality of nozzle heads NZ may be arranged for each of the pixels PX1, PX2, and PX3, and a nozzle group defined by nozzles selected from the plurality of nozzles may be defined in the nozzle heads NZ for each of the pixels PX1, PX2, and PX3 as illustrated in FIG. 3 which will be described below.

The controller CL may control whether to activate some nozzles among the nozzles of the nozzle group in each nozzle head NZ. That is, the controller CL may derive an active nozzle group from among the plurality of nozzle groups and active nozzles of the derived active nozzle group. A detailed description thereof will be made below.

The controller CL may select activated nozzles (i.e., nozzles to be activated) and deactivated nozzles (i.e., nozzles to be deactivated) among the plurality of nozzles based on design requirements, thus effectively prevent undesired injection to reduce cost, and effectively prevent a material from being sprayed at a wrong position.

In an embodiment, the controller CL may control the above movement unit to move the spraying unit SU.

A plurality of application areas may be provided inside the target substrate SUB, and the plurality of application areas may be arranged in one direction and a direction intersecting the one direction. For example, the one direction may be the first direction DR1, and the direction intersecting the one direction may be the second direction DR2.

According to an embodiment of the disclosure, the application area of the target substrate SUB may overlap the respective pixels PX1, PX2, and PX3. The application areas of the target substrate SUB may be smaller than or equal to the respective pixels PX1, PX2, and PX3. That is, the application areas of the target substrate SUB may be arranged in a same manner as an arrangement form of the respective pixels PX1, PX2, and PX3.

Hereinafter, for convenience of description, embodiments where the application areas of the target substrate SUB have a same arrangement form as the arrangement form of the respective pixels PX1, PX2, and PX3, have a same size as the respective pixels PX1, PX2, and PX3, and overlap each other will be described in detail.

FIG. 2B is a plan view illustrating a state in which the spraying unit SU illustrated in FIG. 2A is moved.

In description of FIG. 2B, the description will be focused on parts that are different from those of FIG. 2A, the same reference numerals as in FIG. 2A will be given to substantially the same components, and any repetitive detailed description thereof will be omitted.

The spraying device IPD according to an embodiment of the disclosure may further include a movement unit that moves the spraying unit SU. The spraying unit SU may move in the second direction DR2, which is a column direction of the plurality of first pixels PX1, by the movement unit. The spraying unit SU may spray the material to a row of each of the plurality of first pixels PX1 arranged in the first direction DR1 while moving in the second direction DR2.

In an embodiment, as illustrated in the drawings, the spraying device IPD may include a single spraying unit SU, but the disclosure is not limited thereto, and the spraying device IPD may include a plurality of spraying units SU. Alternatively, the spraying unit SU may be provided to cover the entire target substrate SUB.

FIG. 3 is an enlarged plan view of a portion of the spraying device according to an embodiment of the disclosure.

Referring to FIG. 3, in an embodiment, a plurality of nozzles NZ1 to NZx may be provided each nozzle head NZ in the spraying unit SU. In such an embodiment, the plurality of nozzles NZ1 to NZx may be positioned in the application areas of the target substrate SUB (see FIG. 2A).

FIG. 3 illustrates an embodiment where each nozzle head NZ of the spraying unit SU includes x (x is a natural number) nozzles NZ1 to NZx. The x nozzles NZ1 to NZx may be positioned on one application area. Some of the x nozzles NZ1 to NZx may be activated and the other thereof may be deactivated by the controller CL (FIG. 2A). When a nozzle is activated, the nozzle may spray the material onto the application area of the target substrate, and when the nozzle is deactivated, the nozzle does not spray the material onto the application area of the target substrate. Here, "x" may be a natural number, and for example, "x" may be 20, but the disclosure is not limited thereto. Alternatively, "x" may be 40.

Figure 5:
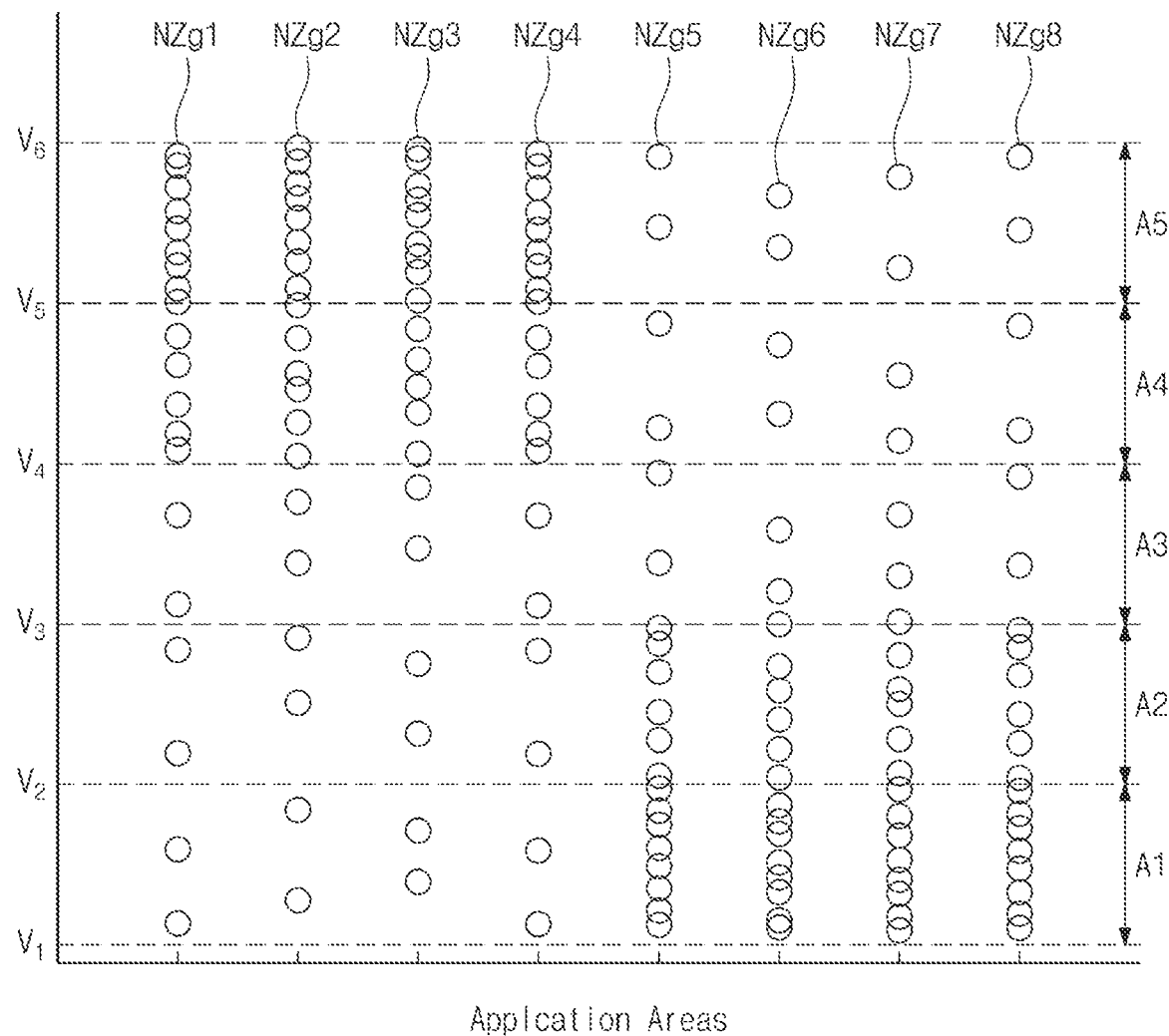
FIG. 5 is a schematic view illustrating nozzle sets of a plurality of nozzle groups of the spraying device according to an embodiment of the disclosure.

In an embodiment, m nozzles NZ1 to NZm (m is a natural number, x m) may be selected from the x nozzles NZ1 to NZx and the selected m nozzles NZ1 to NZm collectively define or constitute one nozzle group NZG. A plurality of nozzle groups NZG may be defined by different combination of n nozzles among the x nozzles. As illustrated in FIG. 5, the m nozzles NZ1 to NZm constituting the one nozzle group NZG may be adjacent to each other, but the disclosure is not limited thereto, and alternatively, the m nozzles NZ1 to NZm may be spaced apart from each other. That is, intervals between the respective nozzles constituting the one nozzle group NZG may be equal to or different from each other.

Discharge amounts of the x nozzles NZ1 to NZx may be equal to or different from each other. That is, discharge amounts of the material sprayed from the respective nozzles NZ1 to NZx may be equal to or different from each other. Such a difference in discharge amounts sprayed from the respective nozzles NZ1 to NZx may be caused by the amount of material delivered to the nozzles, errors in design, or the like. When the material is sprayed onto the application area, to prevent a phenomenon such as a luminance differential due to a difference between the discharge amounts of the nozzles, nozzles that satisfy a specific condition among the plurality of nozzles of each nozzle head NZ are activated, and thus the amount of material sprayed onto the respective application areas may be maintained substantially uniform.

Figure 4:
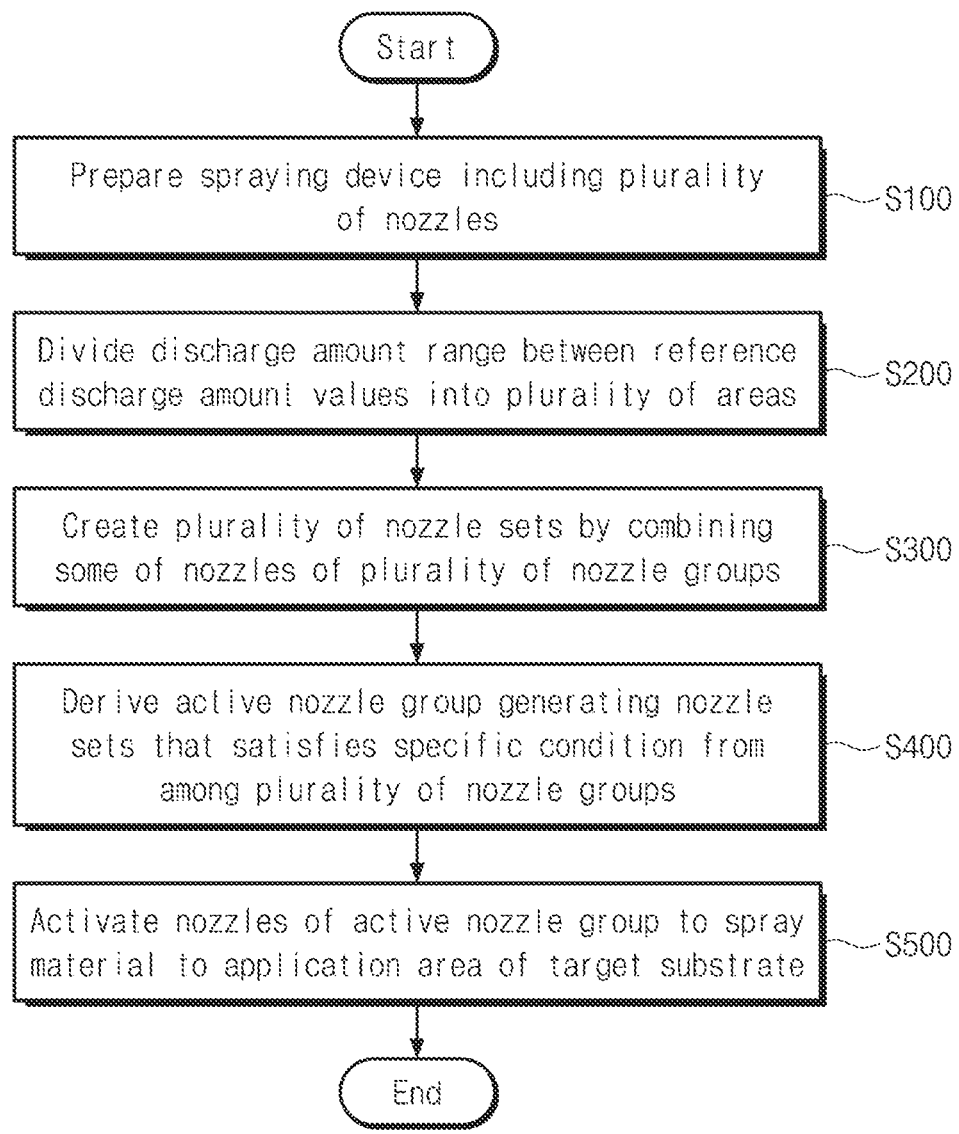
FIG. 4 is a flowchart illustrating a method of manufacturing a display device according to an embodiment of the disclosure.

FIG. 4 is a flowchart illustrating a method of manufacturing a display device according to an embodiment of the disclosure.

Hereinafter, the specific condition for selecting activated nozzles from among the plurality of nozzles to make the amount of material sprayed onto the respective application areas uniform for the nozzles having a same discharge amount as each other or different discharge amounts from each other will be described.

Referring to FIG. 4, a method of manufacturing a display device according to an embodiment of the disclosure may include preparing a spraying device including a plurality of nozzles (S100), dividing a discharge amount range between reference discharge amount values into a plurality of areas (or sub-regions) (S200), creating (or generating) a plurality of nozzle sets by combining some of nozzles of a plurality of nozzle groups (S300), deriving an active nozzle group that satisfies the specific condition from among the plurality of nozzle groups (S400), and activating nozzles of the active nozzle group to spray a material to the application area of the target substrate (S500). Here, the plurality of nozzle may be nozzles of one nozzle head NZ.

The deriving of the active nozzle group that satisfies the specific condition from among the plurality of nozzle groups may be repeatedly performed for each of the application areas. Therefore, the active nozzle groups derived for each of the application areas may be the same as or different from each other.

All these processes may be performed before the spraying unit is moved by the movement unit, but the disclosure is not limited thereto, and all the processes may be performed in an operation in which the spraying unit is moved by the movement unit.

First, the preparing of the spraying device including the plurality of nozzles (S100) will be described.

The spraying device used herein may be the spraying device IPD (see FIG. 2A) described above with reference to FIGS. 1 to 3. However, the disclosure is not limited thereto, various spraying devices may be used, and the spraying devices are not limited to any one embodiment.

The dividing of the discharge amount range between the reference discharge amount values into a plurality of areas (S200) will be described.

The reference discharge amount values may be values related to volumes of the materials to be sprayed onto the above-described application areas, respectively. A first reference discharge amount value and a second reference discharge amount value are defined as examples of the reference discharge amount values.

In an embodiment, the first reference discharge amount value may be a minimum volume of the materials to be sprayed into the application areas, and the second reference discharge amount value may be a maximum volume of the materials to be sprayed into the application areas. In such an embodiment, the first reference discharge amount value and the second reference discharge amount value may be preset values according to (or determined based on) product design. However, the first reference discharge amount value and the second reference discharge amount value may be values that are newly obtained in every case rather than the preset values according to product design. In a combinable nozzle set of one nozzle group among the plurality of nozzle groups, which will be described below, a minimum discharge amount value of each of the nozzle sets may be the first reference discharge amount value, and a maximum discharge amount value thereof may be the second reference discharge amount value. In this way, the first reference discharge amount value and the second reference discharge amount value may be obtained through various methods rather than being determined in any one method, and the disclosure is not limited to any one method.

In the operation, in detail, a discharge amount range between the first reference discharge amount value and the second reference discharge amount value may be divided into k (k is a natural number) areas (or sub-ranges). The discharge amount range between the first reference discharge amount value and the second reference discharge amount value may be divided into k uniform areas (or sub-ranges having uniform range values).

The k areas described herein correspond to a concept different from the application areas described above. The k areas between the first reference discharge amount value and the second reference discharge amount value may be interpreted as k ranges between the first reference discharge amount value and the second reference discharge amount value (or k sub-ranges of a range between the first reference discharge amount value and the second reference discharge amount value).

In an embodiment, for example, k may be a multiple of 5. Referring to FIG. 5 which will be described below, in an embodiment where k is 5, it may be identified that the discharge amount range may be divided into five areas between the first reference discharge amount value and the second reference discharge amount value. In this case, the number of nozzle sets of one nozzle group distributed over the entire k areas may be a multiple of k.

Thereafter, the creating of the plurality of nozzle sets by combining some of the nozzles of the plurality of nozzle groups (S300) will be described.

The plurality of nozzle groups including "m" (m is a natural number) nozzles among the plurality of nozzles are classified or determined. Each of the plurality of nozzle groups classified as above may include "m" nozzles that are the same as or different from each other.

In an embodiment, as described above, the "x" nozzles may be positioned in one application area. Each of the nozzle groups including the "m" nozzles among the "x" nozzles may be created. For each of the nozzle groups including the "m" nozzles, after "n" (n is a natural number, m n) nozzles are selected from among the m nozzles, and the "n" selected nozzles are combined as a nozzle set. The nozzle sets that are obtained or created by combining the "n" selected nozzles of one nozzle group may have the same discharge amount value as each other or different discharge amount values from each other. This process is performed for the plurality of nozzle groups, and a plurality of nozzle sets are created for each of the nozzle groups.

In such an embodiment, a nozzle group including the nozzle sets that satisfy the specific condition among the plurality of created nozzle sets is defined as an active nozzle group.

Hereinafter, the deriving of the active nozzle group that satisfies the specific condition from among the plurality of nozzle groups (S400) will be described.

As described above, the active nozzle group means a nozzle group that satisfy the specific condition among a plurality of generated nozzle groups. The nozzles of each of the active nozzle groups may have the same or different discharge amount values for the application areas of the target substrate.

In an embodiment, a nozzle group satisfies the specific condition when the nozzle sets of the active nozzle group are distributed in the "k" areas in a preset manner.

In such an embodiment, the preset manner is not limited to any one method and may be classified into a plurality of methods. The preset manner may be variously set according to design conditions of a product and is not limited to any one embodiment.

In an embodiment, for example, when the nozzle group satisfies the specific condition, that is, the nozzle sets of the nozzle group are distributed in the "k" areas in the preset manner, the same number of nozzle sets of the nozzle group may be distributed in the "k" areas. That is, in the active nozzle group, the same number of nozzle sets may be present in each of the "k" areas.

In an alternative embodiment, for example, when a nozzle group satisfies the specific condition, that is, the nozzle sets of the nozzle group are distributed in the preset manner in the "k" areas, in the nozzle sets of the nozzle group, the sum of the numbers of nozzle sets positioned in one area among the "k" areas and an area adjacent thereto may be twice the number of nozzle sets positioned in areas not adjacent to the one area.

In one embodiment, for example, one nozzle set of a nozzle group may be positioned in the one area, three nozzle sets of the nozzle group may be positioned in the area adjacent to the one area, and two nozzle sets of the nozzle group may be positioned in an area not adjacent to the one area. In such an embodiment, the total sum of the number of nozzles sets positioned in the area adjacent to the one area is four that is twice the number of nozzle sets positioned in the area not adjacent to the one area, which is two, and in this case, the nozzle group satisfy the specific condition, that is, the nozzle sets of the nozzle group are distributed in the preset manner in the "k" areas.

In such an embodiment, the number of nozzle sets positioned in the adjacent area is not limited to two as described above and may be provided in various numbers, and similarly, the number of nozzle sets positioned in the one area and the area adjacent to the one area may be provided variously.

In an embodiment, when the specific condition is satisfied, through the active nozzle group including the same number of nozzle sets in each of the "k" areas, the sums of the discharge amount values of the activated nozzles may be uniformized or substantially constant, compared to a case where the nozzle group includes randomly distributed nozzle sets without distinction of areas. Therefore, the amounts of the materials sprayed into the application areas may be uniformized or substantially constant. By uniformizing the amounts of the materials sprayed into the adjacent application areas, phenomena such as a luminance differential and Line Mura caused by a difference between the amounts of the materials sprayed between the adjacent application areas may be effectively prevented.

According to an embodiment of the disclosure, an area in which the nozzle sets are arranged corresponds to an area in which the first reference discharge amount value and the second reference discharge amount value are divided into "k" areas or sub-ranges. As a result, there is no significant difference in the discharge amount range between the one area and the area adjacent thereto. Thus, the sum of the number of nozzles between adjacent areas is twice the number of nozzles in the non-adjacent areas, and thus the sums of the discharge values of the activated nozzles may be uniformized. Therefore, by uniformizing the amounts of the materials sprayed into the application areas, the phenomena such as a luminance differential and Line Mura caused by a difference between the amounts of the materials sprayed between the adjacent application areas may be effectively prevented.

Thereafter, the activating of the nozzles of the active nozzle group to spray a material to the application area of the target substrate (S500) will be described.

By activating the nozzles of the derived active nozzle groups, the material may be sprayed onto the application area of the target substrate.

In an embodiment, in the active nozzle groups positioned in a predetermined application area among the plurality of application areas, a distribution relationship between the nozzle sets of each active nozzle group may be the same or different according to the application area. In such an embodiment, the nozzles activated for each of the application areas of the target substrate may have the same or different discharge amount values.

By activating the nozzles of the active nozzle group derived in this way, the materials may be sprayed onto the application areas of the target substrate, and thus the sum of the discharge amount values of the nozzles in each of the application areas may be uniformized.

Therefore, the sum of the discharge amount values of the nozzles in the application areas may be uniformized, and the amount of sprayed materials may be uniformized. By uniformizing amounts of the materials sprayed into the adjacent application areas, the phenomena such as a luminance differential and Line Mura caused by a difference between the amounts of the materials sprayed between the adjacent application areas may be prevented.

FIG. 5 is a schematic view illustrating nozzle sets of a plurality of nozzle groups of the spraying device according to an embodiment of the disclosure.

FIG. 5 illustrates some nozzle sets NZg1, NZg2, NZg3, NZg4, NZg5, NZg6, NZg7, and NZg8 of the nozzle groups generated for the respective application areas with respect to each of the plurality of application areas distinguished by dotted lines in FIGS. 2A and 2B. FIG. 5 illustrates some nozzle sets NZg1, NZg2, NZg3, NZg4, NZg5, NZg6, NZg7, and NZg8 of the nozzle groups sequentially generated for each of eight application areas along a pixel row. That is, FIG. 5 illustrates some nozzle sets of the nozzle groups generated for each of the eight application areas among pixel rows lined up in a traveling direction of the spraying unit.

As described above, for each of the nozzle groups including "m" nozzles, after "n" nozzles are selected among the "m" nozzles, the selected nozzles are combined to generate a plurality of nozzle sets NZg1, NZg2, NZg3, NZg4, NZg5, NZg6, NZg7, and NZg8. For the plurality of nozzle sets NZg1, NZg2, NZg3, NZg4, NZg5, NZg6, NZg7, and NZg8, the respective nozzle sets NZg1, NZg2, NZg3, NZg4, NZg5, NZg6, NZg7, and NZg8 may be dividedly distributed in a plurality of areas A1, A2, A3, A4, and A5.

In FIG. 5, some of the nozzle sets generated by a combination of a case in which m is 5 and n is 2 are shown. In this case, the generated nozzle groups may be dividedly distributed in the plurality of areas A1, A2, A3, A4, and A5. In each of the application areas, 10 nozzle sets caused by the nozzle combination may be generated for one nozzle group. FIG. 5 illustrates the nozzle sets NZg1, NZg2, NZg3, NZg4, NZg5, NZg6, NZg7, and NZg8 generated for some nozzle groups of the plurality of nozzle groups.

For the plurality of areas illustrated in FIG. 5, the number "k" of the plurality of areas may be five. That is, the discharge amount range between the first reference discharge amount value and the second reference discharge amount value may be divided into the five areas A1, A2, A3, A4, and A5, and the nozzle sets may be distributed (or selectively allocated to) in each of the five areas A1, A2, A3, A4, and A5.

According to an embodiment of the disclosure, the first reference discharge amount value may be V1 and the second reference discharge amount value may be V6. In this case, V1 may be a minimum volume of the materials to be sprayed into the application area, and V6 may be a maximum volume of the materials to be sprayed into the application area. However, the disclosure is not limited thereto, V1 may be a minimum discharge amount value for each of the nozzle sets, and V2 may be a maximum discharge amount value for each of the nozzle sets.

In the discharge amount value ranges from V1 to V6, the five areas may be uniformly distinguished. The five areas having the discharge amount value ranges from V1 to V6 may be classified into a first area A1 having a discharge amount value range from V1 to V2, a second area A2 having a discharge amount value range from V2 to V3, a third area A3 having a discharge amount value range from V3 to V4, a fourth area A4 having a discharge amount value range from V4 to V5, and a fifth area A5 having a discharge amount value range from V5 to V6.

In this case, all the first area A1 corresponding to a section from V1 to V2, the second area A2 corresponding to a section from V2 to V3, the third area A3 corresponding to a section from V3 to V4, the fourth area A4 corresponding to a section from V4 to V5, and the fifth area A5 corresponding to a section from V5 to V6 may have the same width. That is, the respective areas A1, A2, A3, A4, and A5 may have a same interval (or a same range width) as each other.

According to an embodiment of the disclosure, the nozzle sets generated in some nozzle groups among the plurality of nozzle groups may be dividedly distributed in the five areas A1, A2, A3, A4, and A5.

In this case, the nozzle sets may be uniformly distributed in the five areas A1, A2, A3, A4, and A5, but the disclosure is not limited thereto, and the nozzle sets may be intensively distributed in one area.

As illustrated in the drawings, distribution relationships of the nozzle sets NZg1, NZg2, NZg3, NZg4, NZg5, NZg6, NZg7, and NZg8 generated for the eighth application areas may be different from each other, but the disclosure is not limited thereto, and some application areas may have the same distribution relationship.

Figure 6:
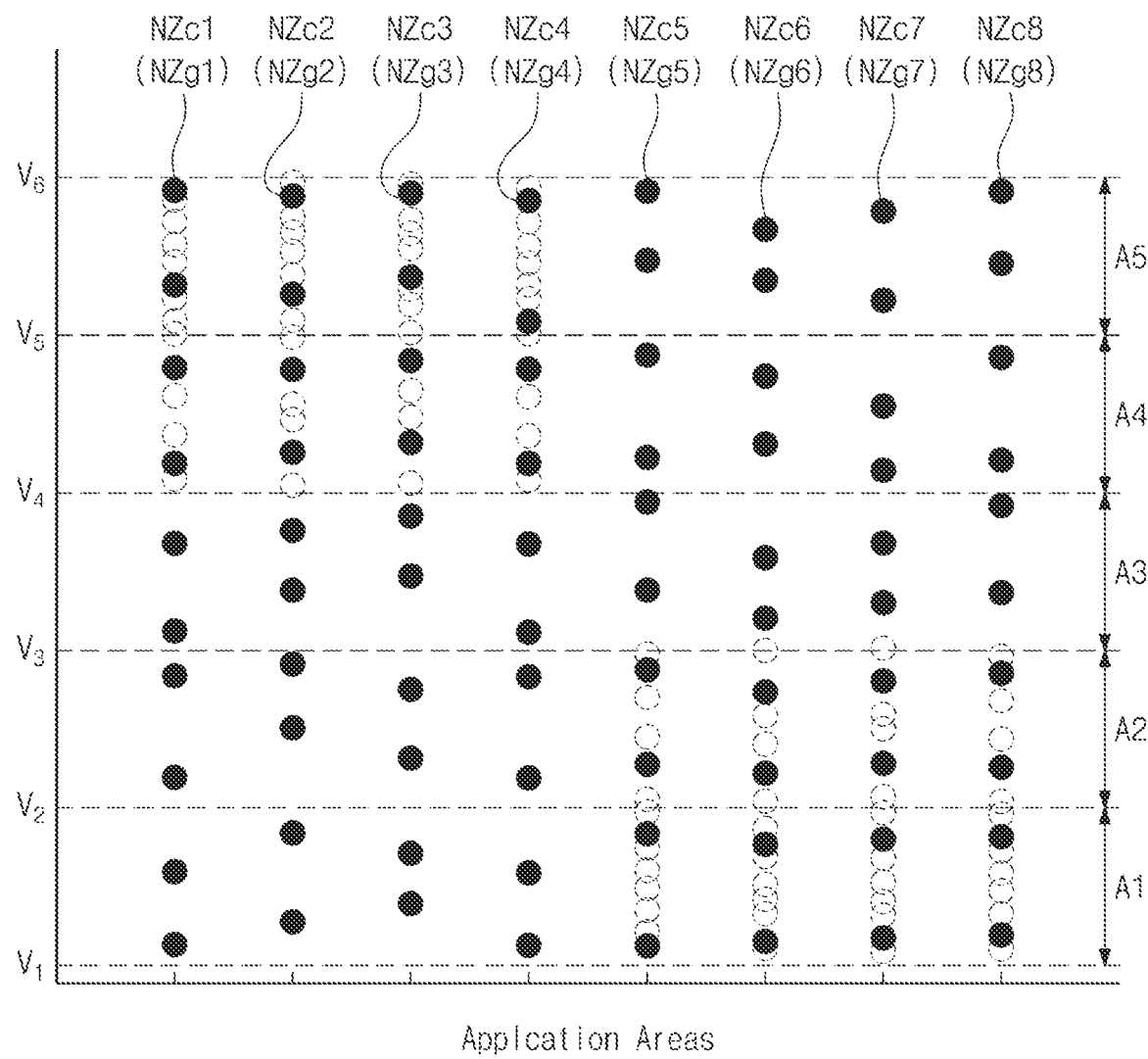
FIG. 6 is a schematic view illustrating nozzle sets of active nozzle groups among the nozzle groups of FIG. 5.

FIG. 6 is a schematic view illustrating nozzle sets of active nozzle groups among the nozzle groups of FIG. 5.

In description of FIG. 6, the description will be focused on parts that are different from those of FIG. 5, the same reference numerals as in FIG. 5 will be given to substantially the same components, and any repetitive detailed description thereof will be omitted.

Referring to FIG. 6, nozzle sets NZc1, NZc2, NZc3, NZc4, NZc5, NZc6, NZc7, and NZc8 of the derived active nozzle group among the plurality of nozzle groups are illustrated as circles of which interiors are filled unlike the nozzle sets NZg1, NZg2, NZg3, NZg4, NZg5, NZg6, NZg7, and NZg8 of the other nozzle groups thereof. That is, the nozzle sets NZc1, NZc2, NZc3, NZc4, NZc5, NZc6, NZc7, and NZc8 of the active nozzle group are illustrated as the circles of which the interiors are filled, and the nozzle sets NZg1, NZg2, NZg3, NZg4, NZg5, NZg6, NZg7, and NZg8 of the other nozzle groups other than the active nozzle group are illustrated as hollow circles.

According to one example of the specific condition described above, the active nozzle group in which the nozzle sets NZc1, NZc2, NZc3, NZc4, NZc5, NZc6, NZc7, and NZc8 are uniformly distributed in the respective areas may be derived.

Further, according to another example of the specific condition described above, the active nozzle group in which the sum of the number of nozzle sets between the adjacent areas is twice the number of nozzle sets of the non-adjacent area may be derived.

According to the active nozzle group derived in this way, the nozzles of the active nozzle group may be activated to spray the materials onto the application areas of the target substrate.

A spraying device and a method of manufacturing a display device according to an embodiment of the disclosure may uniformize the sum of discharge amount values of nozzles inside an application area by determining which nozzles are activated for each application area of a target substrate when a material is sprayed onto the target substrate using a nozzle.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
   preparing a spraying device including a plurality of nozzle heads, wherein each of the plurality of nozzle heads includes a plurality of nozzles;
   dividing a discharge amount value range of each of the plurality of nozzle heads between a first reference discharge amount value and a second reference discharge amount value into k sub-ranges, wherein the second reference discharge amount value is greater than the first reference discharge amount value, and k is a natural number greater than or equal to 2;
   generating nozzle sets by combining n nozzles among m nozzles for each of a plurality of nozzle groups, wherein n is a natural number greater than or equal to 2, and m is a natural number greater than or equal to n, wherein the nozzle sets have a same discharge amount value as one another or different discharge amount values from one another, and each of the plurality of nozzle groups is defined by the m nozzles among the plurality of nozzles; and
   deriving an active nozzle group to be activated from the plurality of nozzle groups, wherein the nozzle sets in the active nozzle group are distributed in a preset manner in the k sub-ranges.

2. The method of claim 1, wherein, in the active nozzle group, a same number of the nozzle sets are distributed in each of the k sub-ranges.

3. The method of claim 1, wherein, in the active nozzle group, a sum of a number of the nozzle sets distributed in one sub-range among the k sub-ranges and a number of the nozzle sets distributed in a sub-range adjacent to the one sub-range among the k sub-ranges is twice a number of the nozzle sets distributed in another sub-range not adjacent to the one sub-range among the k sub-ranges.

4. The method of claim 1, further comprising:
   activating nozzles of the active nozzle group to spray a material to an application area of a target substrate.

5. The method of claim 4, wherein
   the application area is provided in plural,
   a plurality of application areas is arranged in one direction and a direction intersecting the one direction, and
   the deriving the active nozzle group is repeatedly performed for each of the plurality of application areas.

6. The method of claim 5, wherein, in the active nozzle group positioned in each of the plurality of application areas, distribution relationships of the nozzle sets are the same as or different from each other according to the plurality of application areas.

7. The method of claim 1, wherein
   k is a multiple of 5, and
   a total number of the nozzle sets of one nozzle group distributed over the k areas sub-ranges is a multiple of k.

8. The method of claim 7, wherein m is 5, n is 2, and k is 5.

9. The method of claim 1, wherein range widths of the k sub-ranges are the same as each other.

10. The method of claim 1, wherein the first reference discharge amount value and the second reference discharge amount value are a minimum discharge amount value and a maximum discharge amount value of n selected nozzles among the plurality of nozzles, respectively.

11. A method of manufacturing a display device, the method comprising:
    preparing a spraying device including a plurality of nozzle heads, wherein each of the plurality of nozzle heads includes a plurality of nozzles;
    dividing a discharge amount value range of each of the plurality of nozzle heads between a first reference discharge amount value and a second reference discharge amount value into k sub-ranges for one application area among a plurality of application areas on a target substrate, wherein the second reference discharge amount value is greater than the first reference discharge amount value, and k is a natural number greater than or equal to 2;
    generating nozzle sets by combining n nozzles among m nozzles for each of a plurality of nozzle groups, wherein n is a natural number greater than or equal to 2, and m is a natural number greater than or equal to n, and wherein the nozzle sets have a same discharge amount value as one another or different discharge amount values from one another, and each of the plurality of nozzle groups is defined by the m nozzles among the plurality of nozzles; and
    deriving an active nozzle group to be activated from the plurality of nozzle groups, wherein the nozzle sets in the active nozzle group are distributed in a preset manner in the k sub-ranges.

12. The method of claim 11, wherein the discharge amount value range between the first reference discharge amount value and the second reference discharge amount value for each of the plurality of application areas are different from or the same as each other.

13. The method of claim 12, wherein, in the active nozzle group, a same number of the nozzle sets are distributed in each of the k sub-ranges.

14. The method of claim 12, wherein m is 5, n is 2, and k is 5.

15. The method of claim 11, wherein
    the deriving the active nozzle group is repeatedly performed for each of the plurality of application areas, and
    the method further comprises activating nozzles of the active nozzle group for each of the plurality of application areas to spray a material thereto on the target substrate.

* * * * *